United States Patent
Robert et al.

(10) Patent No.: US 9,985,602 B2
(45) Date of Patent: May 29, 2018

(54) RADIO FREQUENCY DEVICE WITH COMPENSATION OF PERMITTIVITY DISPERSION OF THE SUBSTRATE AND ADJUSTMENT METHOD

(71) Applicant: THOMSON LICENSING, Issy de Moulineaux (FR)

(72) Inventors: Jean-Luc Robert, Betton (FR); Dominique Lo Hine Tong, Rennes (FR); Philippe Minard, Saint Medard Sur Ille (FR)

(73) Assignee: THOMSON LICENSING, Issy les Moulineaux (FR)

( * ) Notice: Subject to any disclaimer, the term of this patent is extended or adjusted under 35 U.S.C. 154(b) by 799 days.

(21) Appl. No.: 14/097,200

(22) Filed: Dec. 4, 2013

(65) Prior Publication Data
US 2014/0159987 A1 Jun. 12, 2014

(30) Foreign Application Priority Data
Dec. 5, 2012 (FR) ...................................... 12 61642

(51) Int. Cl.
*H03H 7/40* (2006.01)
*H01Q 9/06* (2006.01)
(52) U.S. Cl.
CPC .............. *H03H 7/40* (2013.01); *H01Q 9/065* (2013.01)
(58) Field of Classification Search
CPC ................................. H03H 7/40; H01Q 9/065
See application file for complete search history.

(56) References Cited

U.S. PATENT DOCUMENTS

| 7,834,813 | B2* | 11/2010 | Caimi ................... H01Q 9/045 343/745 |
| 8,618,817 | B2* | 12/2013 | Jakoby .................... G01F 1/662 324/452 |
| 2006/0281423 | A1 | 12/2006 | Caimi et al. |
| 2008/0186239 | A1 | 8/2008 | Itsuji |

(Continued)

FOREIGN PATENT DOCUMENTS

| CN | 101496222 | 7/2009 |
| CN | 102301530 | 12/2009 |

(Continued)

OTHER PUBLICATIONS

Search Rept: dated Jun. 17, 2013.

(Continued)

*Primary Examiner* — Graham Smith
*Assistant Examiner* — Noel Maldonado
(74) *Attorney, Agent, or Firm* — Brian J. Dorini; Patricia A. Verlangieri

(57) ABSTRACT

The invention relates to a device for transmitting and/or receiving radio frequency signals comprising at least one antenna and/or at least one filter realised in printed technology on a dielectric substrate. According to the invention, this device is equipped with means for compensating the permittivity dispersions of the substrate. For this purpose, the device comprises a circuit for measuring the dielectric permittivity of the substrate able to deliver a measured permittivity value and adjustment means able to adjust the impedance of the antenna and/or the frequency response of said filter according to said measured permittivity value.

17 Claims, 5 Drawing Sheets

(56) References Cited

U.S. PATENT DOCUMENTS

2010/0148804 A1  6/2010  Jakoby
2010/0168817 A1  7/2010  Yamamoto et al.

FOREIGN PATENT DOCUMENTS

| EP | 0971227 | 1/2000 |
| --- | --- | --- |
| EP | 1112485 | 12/2009 |
| JP | 2006275687 | 10/2006 |
| KR | 2011087380 | 8/2011 |

OTHER PUBLICATIONS

Janezic et al. " Broadband Complex Permittivity Measurements of Dielectric Substrates using a Split-Cylinder Resonator", 2004 IEEE MTT-S Digest, 2004, p. 1817-1820, IEEE, Boulder, CO.
Semouchkina et al. "High Frequency Permittivity Determination by Spectra Simulation and Measurement of Microstrip Ring Resonators", Electronics Letters, May 25, 2005, vol. 36, No. 11, p. 956-958, University Park, PA.

\* cited by examiner

US 9,985,602 B2

RADIO FREQUENCY DEVICE WITH COMPENSATION OF PERMITTIVITY DISPERSION OF THE SUBSTRATE AND ADJUSTMENT METHOD

This application claims the benefit, under 35 U.S.C. §119 of French Patent Application 1261642, filed Dec. 5, 2012.

TECHNICAL FIELD

The present invention relates to the field of radio frequency devices realised on circuit boards comprising a dielectric substrate. The invention relates more specifically to devices for transmitting and/or receiving radio frequency signals comprising at least one antenna and/or one filter realised in printed circuit technology on a substrate of dielectric material.

PRIOR ART

To obtain a high level of integration, radio frequency devices are traditionally realised on one or more printed circuit boards having a dielectric substrate. In such devices, the antenna is traditionally realised by a layer of conductive material of appropriate geometric form which is placed on the dielectric substrate. The conductive layer can be formed by one or more radiating strands of a particular form or by a conductive plate provided with slots. These devices also traditionally comprise filters. These filters can be realised, entirely or partially, by conductive lines, for example microstrip lines, arranged on the dielectric substrate.

It is known that the behaviour of these antennae and/or filters is strongly linked to the electrical and mechanical properties of the dielectric material of the substrate. It is also known that, in the field of consumer electronics devices, the material commonly used to manufacture the substrate is of FR4 type which is a low-cost material. The disadvantage of this material is that it has a relatively high dispersion in terms of dielectric permittivity values. This range of variation in the permittivity is larger or smaller according to the manufacturers. Generally, the more expensive the material, the more the range of variation in the permittivity is reduced.

This dispersion of the permittivity can impact several critical functions of the reception and/or transmission channel of the radio frequency devices, notably the behaviour of the antennae and filters realised with this dielectric substrate. More specifically, it creates frequency drifts in the response of the filters and causes the impedance of the antennae to drift thus leading to a degradation in performance thereof.

Currently, manufacturers of radio frequency devices on printed circuits have two options to prevent these drifts:
1) they use a dielectric substrate having a low variation in permittivity, which incurs an additional cost for the device; or
2) they modify the technical characteristics of the device to take into account this potential variation in the permittivity of the substrate by increasing the bandwidth of the antennae, for example, but this leads to a degradation in performance of the device.

DESCRIPTION OF THE INVENTION

The invention proposes another solution making it possible to continue to use a low-cost dielectric material without degrading performance of the antenna or of the filter of the radio frequency device.

According to the invention, it is proposed to equip the radio frequency device with a circuit for measuring a value linked to the permittivity of the dielectric substrates and with circuits making it possible to adjust the frequency response of the filter and the impedance of the antenna according to the measured permittivity value.

For this purpose, the invention relates to a device for transmitting and/or receiving radio frequency signals comprising at least one antenna and/or one filter realised in printed technology on a dielectric substrate, characterised in that it further comprises a circuit for measuring a value linked to the dielectric permittivity of the substrate able to deliver a measured value linked to the permittivity and adjustment means able to adjust the impedance of the antenna and/or the frequency response of said filter according to said measured value.

Thus, according to the invention, the impedance of the antenna and/or the frequency response of the filters of the device are adjusted by taking into account the real value of the permittivity of the substrate. The mismatching of the antenna and/or the frequency drifts in the response of the filter linked to the dispersion of the permittivity of the substrate are thus avoided.

According to a particular embodiment, the adjustment means comprise:
- an adjustment control circuit able to receive the measured permittivity value and to deliver at least one digital control signal according to said measured permittivity value; and
- an impedance matching connected to the input/output of said antenna and controlled by said at least one digital control signal to modify the impedance of the antenna and restore it to a predetermined value and/or a variable-capacitance element, in said filter, controlled by said at least one digital control signal to modify the frequency response of said at least one filter and restore it to a predetermined value.

According to one embodiment, the impedance matching network comprises an adjustable capacitor digitally controlled by said at least one digital control signal. The variable-capacitance element inside said at least one filter is a varactor diode.

According to a particular embodiment, the circuit measuring a value linked to the permittivity comprises:
- a radio frequency signal generator digitally controllable by a control signal and able to generate a plurality of radio frequency signals of different frequencies inside a predetermined frequency band;
- a resonator able to receive the radio frequency signals generated by the generator and to deliver, for each of these signals of different frequencies, an output signal;
- a power measuring circuit for measuring the signal power for each of the output signals delivered by said resonator;
- a microcontroller for determining the resonance frequency of the resonator from the power values measured by the power measuring circuit and for generating the signal for controlling the radio frequency signal generator; and
- a processor for calculating the relative permittivity of the substrate from said resonance frequency.

According to a particular embodiment, said resonator is a ring resonator. According to a variant, the resonator is a resonator comprising a rectilinear microstrip line having a length substantially equal to $$\frac{\lambda_g}{2}$$

where $\lambda_g$ is the radio frequency signal wavelength.

Advantageously, the resonator is designed to have a resonance frequency close to the frequency of the radio frequency signals transmitted or received.

According to a particular embodiment wherein the device comprises at least two transmission and/or reception channels operating at different operating frequencies and each comprising at least one antenna and/or at least one filter realised in printed technology on a single dielectric substrate and further comprises a circuit measuring a value linked to the permittivity for measuring the relative permittivity of said dielectric substrate, the resonator of the measuring circuit is designed to have a resonance frequency close to the highest operating frequency which is generally the frequency most sensitive to the drifts caused by the dispersion of the permittivity of the substrate.

The purpose of the invention is also a method for adjusting the impedance of an antenna and/or the frequency response of a filter of a device such as previously defined, which comprises the following steps:
generating a plurality of radio frequency signals of different frequencies in a predetermined frequency band;
measuring a value linked to the relative permittivity of the substrate; and
delivering control signals for adjusting the impedance of the antenna and/or the frequency response of the filter according to said measured permittivity value.

Advantageously, this method is implemented only once when the device is first switched on.

BRIEF DESCRIPTION OF THE FIGURES

Other advantages may also occur to those skilled in the art upon reading the examples below, illustrated by the annexed figures, given by way of illustration.

DETAILED DESCRIPTION OF THE INVENTION

Figure 1:
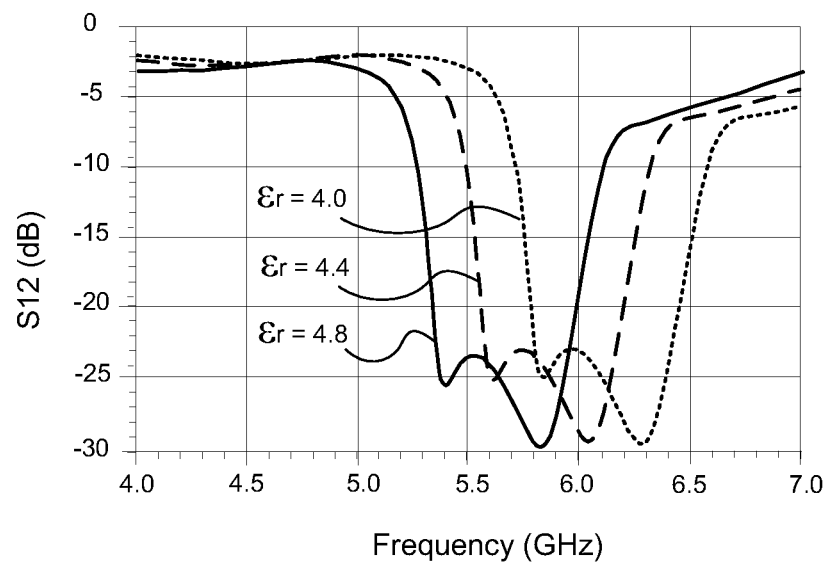
FIG. 1 is a diagram showing the frequency drifts of a band-rejection filter realised on substrate when the relative permittivity of the substrate varies by around ±10%.

FIG. 1 shows the frequency response (parameter S12) of a band-rejection filter realised in microstrip lines on a dielectric substrate as a function of the relative permittivity $\in_r$ of the substrate. This filter is intended to remove frequencies in the 5 GHz-7 GHz band. Three frequency response curves are shown:
a first curve realised with a dielectric substrate having a relative permittivity $\in_r$ equal to 4.4;
a second curve realised with a dielectric substrate having a relative permittivity $\in_r$ equal to 4.0; and
a third curve realised with a dielectric substrate having a relative permittivity $\in_r$ equal to 4.8.

This figure shows that a relative permittivity dispersion $\in_r$ of around ±10% can lead to a frequency drift of ±200 MHz, which is unacceptable in many fields, notably in the field of transmission and reception of multimedia signals, such as 2.4 & 5 GHz Wi-Fi, DECT, 3G, Bluetooth, ZigBee or GPS signals.

The higher the frequency, the more the impact of the dispersion of the relative permittivity value $\in_r$ of the substrate impacts the response of the filter, and this is true regardless of the type of filter (band-rejection, band-pass, low-pass, high-pass).

The dispersion of the relative permittivity of the substrate likewise impacts the impedance of antennae realised in printed technology on dielectric substrate.

According to the invention, it is therefore proposed to adjust the frequency response of the filter and/or the impedance of the antenna of radio frequency devices according to the effective value of the relative permittivity $\in_r$ of the dielectric substrate on which they are realised.

According to the invention, it is proposed to measure a value linked to the relative permittivity $\in_r$ of the substrate then to adjust the frequency response of the filter and/or the impedance of the radio frequency device according to the measured value.

The relative permittivity $\in_r$ of the dielectric substrate of a printed circuit board can be measured according to different known techniques. One of them consists in realising, on the circuit board for which the permittivity of the substrate is to be measured, a ring resonator, for example with microstrip lines, then determining the resonance frequency of this ring. Such a resonator is shown diagrammatically in FIG. 2.

In the case of a resonator circuit with microstrip lines, the electromagnetic waves propagate in a heterogeneous medium formed from substrate, microstrip lines and air. The dielectric permittivity of this heterogeneous medium, commonly called effective dielectric permittivity $\in_{r\;eff}$, is determined by the following equations:

$$l = 2 \times \pi \times r = \frac{n \times \lambda_g}{2} \quad (1)$$

$$\lambda_g = \frac{\lambda_0}{\sqrt{\varepsilon_{reff}}} = \frac{4 \times \pi \times r}{n} \quad (2)$$

where l is the circumference of the ring of the resonator and is equal to $$\frac{n}{2} \times \lambda_g,$$

$\lambda_g$ is the wavelength of radio frequency signals propagating in said heterogeneous medium at the resonance frequency f, r is the radius of the ring of the resonator and $\lambda_0$ is the wavelength of radio frequency signals propagating in the vacuum at the resonance frequency f;

If equations (1) and (2) are combined, the following equation is obtained:

$$\varepsilon_r \textit{eff} = \left(\frac{n \times \lambda_0}{4 \times \pi \times r}\right)^2 \quad (3)$$

$$= \left(\frac{n \times c}{4 \times \pi \times r \times f}\right)^2$$

$$= \left(\frac{n \times c}{2 \times l \times f}\right)^2$$

where f is the resonance frequency of the ring and c is the speed of light in the vacuum ($3.10^8$ m/s).

The preceding equations show the relationships between the resonance frequency f of the resonator and the effective dielectric permittivity $\varepsilon_{r\,\textit{eff}}$. This latter is linked to the relative permittivity $\varepsilon_r$ of the substrate by the following relationship:

$$\varepsilon_{\textit{reff}} = \frac{\varepsilon_r + 1}{2} + \frac{\varepsilon_r - 1}{2}\left(1 - 10\frac{h}{w}\right)^{-0.5} \quad (4)$$

where h represents the thickness of the substrate and w is the width of the microstrip line forming the ring.

The relative permittivity $\varepsilon_r$ of the substrate is therefore obtained by the following relationship:

$$\varepsilon_r = \frac{\varepsilon_{\textit{reff}}\left(\sqrt{1 - 10\frac{h}{w}} - 1\right) + 1}{1 + \sqrt{1 - 10\frac{h}{w}}} \quad (5)$$

Thus, by determining the resonance frequency f of the ring, it is possible to deduce very precisely the effective relative permittivity $\varepsilon_{r\,\textit{eff}}$ using equation (3) then the relative permittivity $\varepsilon_r$ of the substrate using equation (5).

Determining the resonance frequency f consists in determining the signal frequency for which the power delivered by the resonator is maximum.

Figure 3:
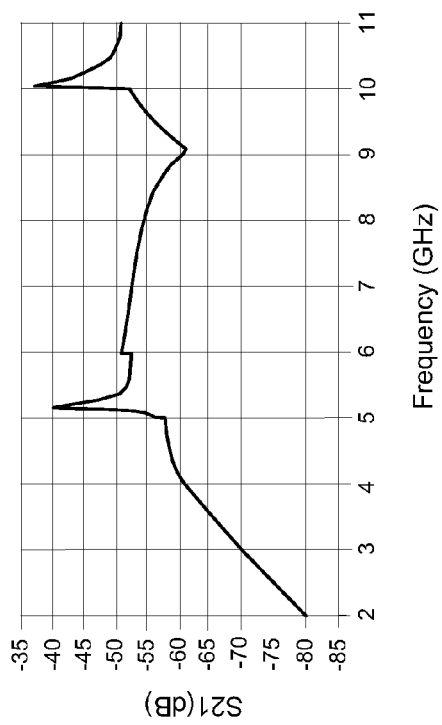
FIG. 3 is a diagram showing the frequency response of the resonator of FIG. 2.

FIG. 3 shows the HFSS (High Frequency Structural Simulator) simulation of the frequency response (parameter S21) of a ring resonator such as shown by FIG. 3. This simulated response was obtained for a substrate having a relative permittivity $\varepsilon_r$ equal to 4.4 and a loss tangent of 0.02.

As can be seen in this figure, the response of the resonator has an amplitude peak at the resonance frequency f (around 5.25 GHz in the present case) and at its harmonics.

Detecting this amplitude peak makes it possible to determine the resonance frequency f of the resonator and to deduce the relative permittivity $\varepsilon_r$ of the substrate using equations (3) and (5), the parameters n, l, h and w being known parameters.

Figure 2:
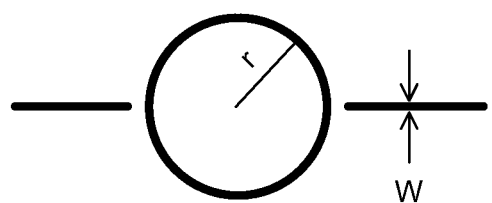
FIG. 2 is a schematic diagram of a ring resonator used to measure the real relative permittivity of a substrate on which it is realised.

To determine the relative permittivity $\varepsilon_r$ of the substrate, the circuit measuring a value linked to the permittivity must therefore not only comprise a resonator such as defined in FIG. 2 but also means for supplying to the resonator a radio frequency signal of variable frequency, means for determining the resonance frequency of the resonator and means for calculating the relative permittivity $\varepsilon_r$ of the substrate from the resonance frequency.

Figure 4:
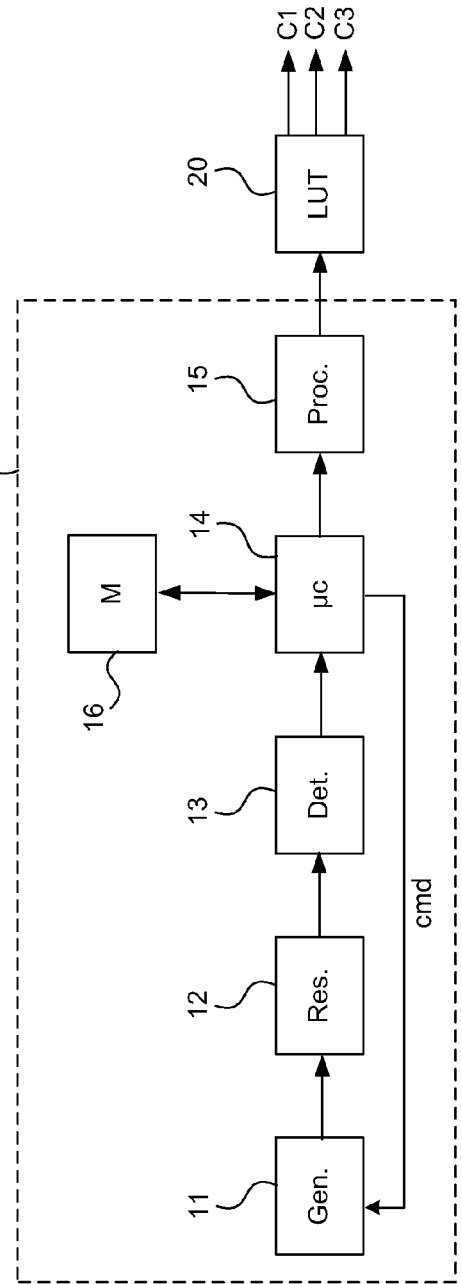
FIG. 4 is a diagram of a circuit measuring a value linked to the permittivity and an adjustment control circuit intended to generate adjustment signals to adjust the impedance of the antenna and the frequency response of a filter of a radio frequency device according to the measured value.

In reference to FIG. 4, the circuit 10 measuring a value linked to the permittivity of the substrate comprises:

a radio frequency signal generator 11 digitally controllable and able to generate a plurality of radio frequency signals of different frequencies, the frequency of the generated signals varying for example according to a predefined frequency step in a predetermined frequency band; the generator 11 is controlled by a control signal cmd to vary the frequency of the generated signal; the generator sweeps over a relatively wide frequency band around its so-called nominal resonance frequency calculated by a so-called nominal permittivity value of the substrate to include the potential frequency drifts due to the permittivity dispersion of the substrate;

a resonator 12 such as previously defined able to receive the radio frequency signals generated by the generator 11 and to deliver, for each of these signals of different frequencies, an output signal;

a power measuring circuit 13 for measuring the signal power for each of the output signals delivered by the resonator;

a microcontroller 14 for determining the resonance frequency of the resonator from the power values measured by the power measuring circuit 13 and for generating the signal cmd for controlling the radio frequency signal generator 11; and a processor 15 for calculating the relative permittivity $\varepsilon_r$ of the substrate from the resonance frequency f determined by the microcontroller 14.

The circuit measuring a value linked to the permittivity also comprises a memory 16 connected to the microcontroller 14 for storing at least temporarily the power values measured by the power measuring circuit 13.

The generator 11 sequentially delivers a plurality of radio frequency signals in a frequency band to be analysed. As indicated above, this frequency band to be analysed includes the so-called nominal resonance frequency of the resonator obtained for a nominal relative permittivity value provided by the manufacturer of the substrate (for example, $\varepsilon_r$=4.55) and the frequencies around this nominal resonance frequency corresponding to the drifts of the resonance frequency which would be due to the dispersion of the relative permittivity of the substrate.

Figure 5:
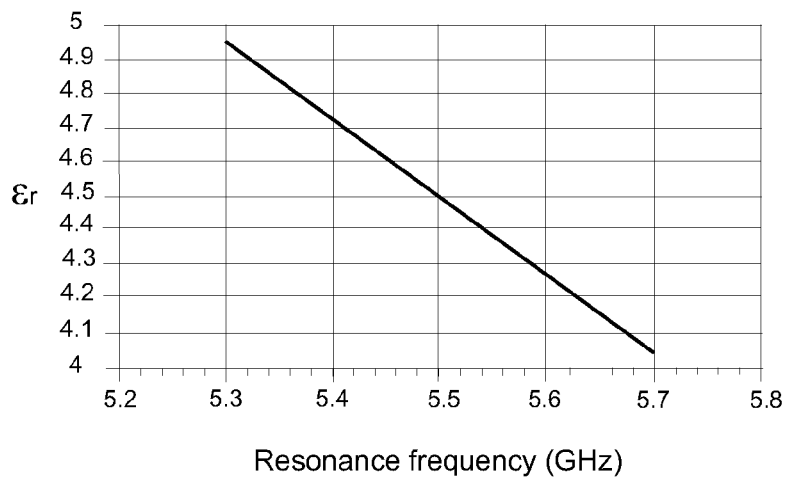
FIG. 5 is a curve showing the variation of the relative permittivity of the substrate determined from the resonator of FIG. 2 as a function of its resonance frequency.

For example, if we consider a resonator realised on a substrate of FR4 type having a nominal relative permittivity $\varepsilon_r$ equal to 4.5 liable to vary by around ±10%, that is to say between 4.05 and 4.95, whose resonance frequency varies between 5.3 GHz and 5.7 GHz as shown in the diagram of FIG. 5, the microcontroller 14 controls, via the signal cmd, the generator 11 so that it sweeps over the frequency band comprised between 5.3 GHz and 5.7 GHz. The resonance frequency of the resonator is preferably close to the highest working frequency of the transmission/reception device in which it is inserted. This frequency generally corresponds to the frequency most sensitive to the drifts due to the dispersion of the permittivity of the substrate.

The frequency band is swept over with a predetermined value step, for example 100 KHz. The smaller this step, the more accurately the resonance frequency of the resonator will be determined.

The resonator 12 is successively supplied with each of the signals generated by the generator 11. The amplitude of the signal delivered thereby thus has a maximum as the resonance frequency of the resonator is approached.

Figure 6:
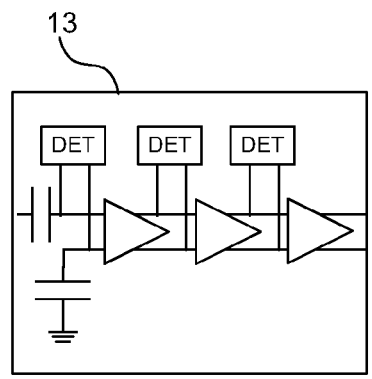
FIG. 6 is a diagram of a power measuring circuit included in the measuring a value linked to the permittivity circuit of FIG. 2.

At the output of the resonator 12, the power measuring circuit 13 measures the power of the signal delivered by the resonator 12. The diagram of an example of a logarithmic power measuring circuit is shown in FIG. 6. This power detector is well known in the art. It has a very high sensitivity and a wide dynamic range. At output, it generates a DC voltage in volts proportional to the RF input voltage in dBm.

The microcontroller 14 stores the power values measured by circuit 13 in the memory 16 then determines the maximum power value for a full sweep of the frequency band to be analysed.

The microcontroller 14 then determines the frequency of the signal supplied to the resonator giving this maximum power. This frequency corresponds to the resonance frequency f of the resonator.

The microcontroller 14 supplies this resonance frequency value f to the processor 15 which calculates, by means of equations (3) and (5), the relative permittivity value $\in_r$ of the substrate.

Once this relative permittivity value is calculated, the circuit 10 measuring a value linked to the permittivity, by the intermediary of the processor 15, supplies this value to an adjustment control circuit 20 able to control adjustment means intended to adjust the impedance of antennae and/or the frequency response of filters of a radio frequency device.

In FIG. 4, the adjustment control circuit 20 is presented in the form of a table to be consulted or LUT (Look-Up Table) receiving at input the relative permittivity value supplied by the circuit 10 measuring a value linked to the permittivity and delivering at output a plurality of control signals C1, C2, C3 for controlling the adjustment of antennae and filters of the radio frequency device.

Figure 7:
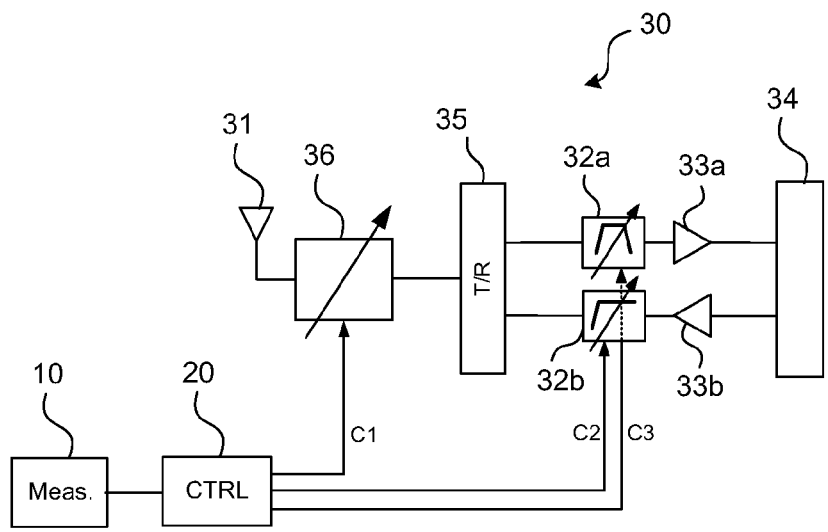
FIG. 7 shows the schematic diagram of a first device for transmitting/receiving radio frequency signals according to the invention.

A device for transmitting and/or receiving radio frequency signals according to the invention is shown in FIG. 7. The device, having reference number 30, comprises a radio frequency signal transmission/reception channel, for example for transmitting/receiving 5 GHz Wi-Fi signals.

This transmission/reception channel comprises an antenna 31, a band-pass filter 32a for filtering the RF signals received by the antenna, a low noise amplifier 33a for amplifying the signals output from the filter 32a and a processing circuit 34 for processing the RF signals delivered by the amplifier 33a. This circuit 34 is notably able to convert the received RF signals into baseband signals. The channel also comprises a power amplifier 33b for amplifying the RF signals to be transmitted generated by the processing circuit 34 and a high-pass filter 32b for filtering the signals amplified by the amplifier 33b. A switching circuit 35 is also placed between filters 32a and 32b and the antenna 31 in order to connect the antenna 31 selectively to filter 32a (reception) and filter 32b (transmission).

For the implementation of the invention, the device 30 also comprises a measuring circuit and a control circuit 20 as previously described and a matching network 36 for adjusting the impedance of the antenna to a predetermined value, for example 50 ohms, according to the measured relative permittivity. Moreover, filters 32a and 32b are filters whose frequency response is adjustable according to the measured relative permittivity.

The adjustment control circuit 20 delivers three control signals:
- a control signal C1 for adjusting the impedance of the antenna so that it is equal to a reference value, for example 50 ohms;
- a control signal C2 for adjusting the frequency response of the band-pass filter 32a to a predetermined value; and
- a control signal C3 for adjusting the response of the high-pass filter 32b to another predetermined value.

Figure 8:
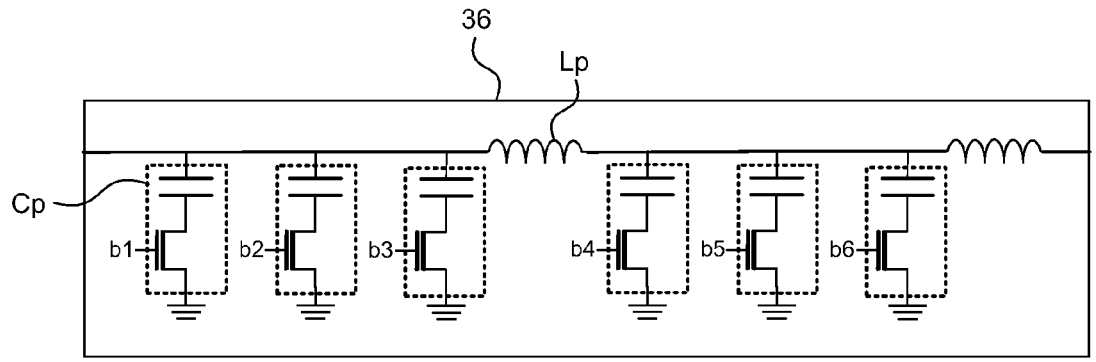
FIG. 8 shows the schematic diagram of a matching network of the device of FIG. 7.

The matching network 36 is for example formed by one or more elementary impedance networks having an L or a Pi topology. This network comprises at least one DTC (Digitally Tunable Capacitor) constructed from a plurality of switched capacitors digitally controlled by a plurality of bits b1 . . . bi of the control signal C1 as shown in FIG. 8.

In this figure, the matching network 36 comprises two elementary LC networks having an L topology. Each elementary network comprises an inductor Lp between the input and the output of the elementary network and 3 parallel switched capacitors Cp between the input of the elementary network and the earth. Each of the switched capacitors is controlled by a bit of the control signal C1. In this example, the control signal C1 therefore comprises 6 bits to vary the impedance of the antenna 31, that is to say 64 possible values.

Likewise, filters 32a and 32b each comprise at least one DTC or one varactor diode to vary their frequency response according to control signals C2 and C3.

The different control signals C1, C2, C3 necessary to obtain the different possible adjustments are defined in advance and are stored in the look-up table 20.

During operation, when the measuring circuit 10 delivers a relative permittivity value of the substrate, this latter is transmitted to the look-up table 20 which delivers the appropriate control signals C1, C2, C3 to adjust the matching network 36 and filters 32a and 32b.

This adjustment of the matching network and filters is preferably carried out only once when the radio frequency device is first switched on.

Figure 9:
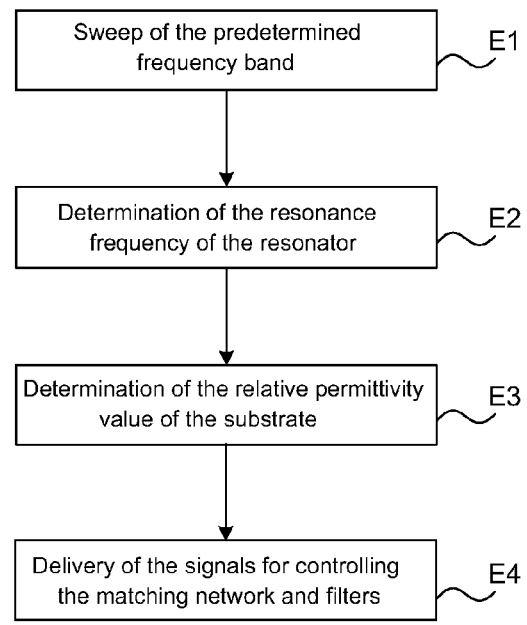
FIG. 9 shows the steps of an adjustment method of the matching network and of the filters of the device of FIG. 7.

In reference to FIG. 9, the adjustment of the matching network 36 and filters 32a and 32b is carried out in the following way:
- step E1: the generator 32 successively generates signals of different frequencies in a predetermined frequency band according to a predetermined frequency step until said frequency band has been entirely swept;
- step E2: the microcontroller 14 determines the resonance frequency of the resonator;
- step E 3: the processor 15 determines the relative permittivity value of the substrate; and
- step E4: the control circuit 20 delivers the appropriate control signals to the matching network 32 and filters 32a and 32b.

The device of the invention can only comprise one transmission channel or one reception channel. In contrast, it can also comprise a plurality of transmission/reception channels as shown in FIG. 10.

Figure 10:
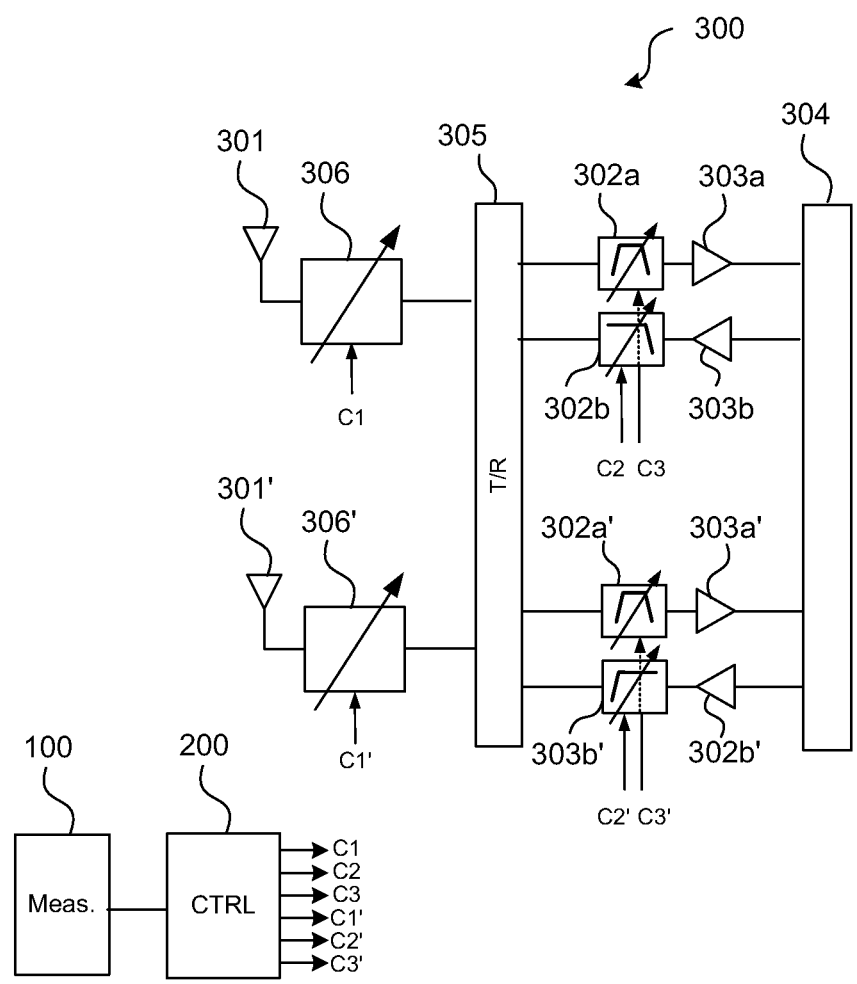
FIG. 10 shows the schematic diagram of a first device for transmitting/receiving radio frequency signals according to the invention.

FIG. 10 shows a device 300 according to the invention which comprises two transmission/reception channels, one being for example dedicated to transmitting/receiving 5 GHz Wi-Fi signals and the other to transmitting/receiving 2.4 GHz Wi-Fi signals, a measuring circuit 100 identical to circuit 10 and a control circuit 200 able to deliver a plurality of control signals for the adjustable circuits of the two transmission/reception channels of the device.

The first channel for transmitting/receiving 5 GHz Wi-Fi signals is identical to that of FIG. 7. It therefore comprises an antenna 301 identical to antenna 31, a matching network 306 identical to network 36, a band-pass filter 302a identical to filter 32a, a low noise amplifier 303a identical to amplifier 33a, a high-pass filter 302b identical to filter 32b and a power amplifier 303b identical to amplifier 33b.

The second channel for transmitting/receiving 2.4 GHz Wi-Fi signals comprises an antenna 301', a matching network 306', a band-pass filter 302a', a low noise amplifier 303a', a low-pass filter 302b' and a power amplifier 303b' arranged in the same way as the corresponding elements of the first transmission/reception channel. Note, however, that the high-pass filter (302b) in the first transmission/reception channel is replaced by a low-pass filter (302b') in the second transmission/reception channel.

Device 300 also comprises a switching circuit 305 and a processing circuit 304 common to the two reception channels. The switching circuit 305 selectively connects filters 302a and 302b to antenna 301 via matching network 306 and filters 302a' and 302b' to antenna 301' via matching network 306'. Processing circuit 304 carries out the conversion of the radio frequency signals into baseband signals and vice versa.

In this embodiment, control circuit 200 produces control signals C1, C2, C3, C1', C2' and C3' for controlling respectively the adjustable elements 306, 302b, 302a, 306', 302b' and 302a'.

The adjustment of the adjustable elements of the device is performed as previously described for the device of FIG. 7. However, in the case of radio channels operating at very different frequencies as is the case here, 5 GHz for the first radio channel and 2.4 GHz for the second radio channel, it is possible to provide two resonators, namely a resonator for each radio channel, one of these resonators having a resonance frequency close to 5 GHz and the other resonator having a resonance frequency close to 2.4 GHz so as to increase the permittivity measurement accuracy according to the working frequency. Each of these resonators is thus used to determine the control signals of the associated radio channel.

According to a variant embodiment, the device comprises only one resonator to reduce the space occupied by the measuring circuit. In this particular embodiment, we preferably choose a resonator having a resonance frequency close to the highest working frequency of the device, in the present case 5 GHz, in order to further minimise the space occupied by the resonator.

This matching of the frequency response of the filter and of the impedance of the antennae is therefore particularly useful in the case of a multi-radio device realised on low-cost substrates, for example substrates of FR4 type.

Although the invention has been described in relation to two particular embodiments, it is obvious that it is in no way restricted and that it comprises all the technical equivalents of the means described together with their combinations if the latter fall within the scope of the invention.

Naturally, resonators of types other than ring resonators can be used, notably resonators comprising a rectilinear microstrip line having a length substantially equal to $$\frac{\lambda_g}{2}.$$

The invention is applicable to a device which comprises only one transmission channel or only one reception channel. It is also applicable to a device wherein only the impedance of the antenna is adjusted (without modifying the frequency response of the filters) or wherein only the frequency response of the filters is adjusted (without modifying the impedance of the antenna).

The invention claimed is:

1. A device for processing radio frequency signals comprising:
   at least one antenna;
   at least one filter, said at least one antenna and said at least one filter being provided on a dielectric substrate;
   a circuit, configured to measure a value linked to a dielectric permittivity of the dielectric substrate on which said at least one antenna and said at least one filter are provided and
   to adjust at least one of an impedance of the at least one antenna and a frequency response of said at least one filter according to said measured value linked to said dielectric permittivity of the dielectric substrate on which said at least one antenna and said at least one filter are provided.

2. The device according to claim 1, wherein the circuit receives the measured value linked to the dielectric permittivity and generates at least one digital control signal according to said measured value; and the device further comprises at least one of an impedance matching network connected to an input/output of said at least one antenna and controlled by said at least one digital control signal to modify the impedance of the at least one antenna and restore the impedance to a predetermined value and a variable-capacitance element, in said at least one filter, controlled by said at least one digital control signal to modify the frequency response of said at least one filter and restore the frequency response to a predetermined value.

3. The device according to claim 2, wherein the impedance matching network comprises an adjustable capacitor digitally controlled by said at least one digital control signal.

4. The device according to claim 2, wherein the variable-capacitance element in said at least one filter is a varactor diode.

5. The device according to claim 1, wherein the measuring circuit comprises:
   a radio frequency signal generator digitally controlled by a control signal to generate a plurality of radio frequency signals of different frequencies within a predetermined frequency band;
   a resonator, configured to receive the radio frequency signals generated by the radio frequency signal generator and to deliver, for each of these signals of different frequencies, an output signal;
   a power measuring circuit, configured to measure the signal power for each of the output signals delivered by said resonator;
   a microcontroller, configured to determine the resonance frequency of the resonator from the signal power measured by the power measuring circuit and to generate the control signal for controlling the radio frequency signal generator; and
   a processor, configured to calculate a relative dielectric permittivity of the substrate from said determined resonance frequency.

6. The device according to claim 5, wherein said resonator is a ring resonator.

7. The device according to claim 5, wherein the resonator has a resonance frequency close to the frequency of the radio frequency signals.

8. The device according to claim 5, further comprising at least two channels operating at different operating frequencies each of the at least two channels comprising
at least one antenna;
at least one filter, said at least one antenna and said at least one filter being provided on a single dielectric substrate;
the circuit configured to measure a value linked to the dielectric permittivity for measuring a relative dielectric permittivity of said dielectric substrate on which said at least one antenna and said at least one filter are provided, wherein the resonator of the circuit measuring a value linked to the dielectric permittivity is designed to have a resonance frequency close to the highest operating frequency.

9. A method for adjusting at least one of an impedance of an antenna and a frequency response of a filter of a device, comprising:
generating a plurality of radio frequency signals of different frequencies in a predetermined frequency band;
measuring a relative permittivity value of a dielectric substrate on which the antenna and filter are provided; and
delivering control signals for adjusting at least one of the impedance of the antenna and the frequency response of the filter according to said measured relative permittivity value of the dielectric substrate on which said at least one antenna and said at least one filter are provided.

10. The method according to claim 9, wherein the method is performed when the device is first switched on.

11. The method according to claim 9, further comprising:
receiving the measured relative permittivity value;
generating at least one digital control signal according to said measured relative permittivity value; and, at least one of:
modifying, by an impedance matching network, the impedance of the antenna to restore the impedance to a predetermined value; and
modifying, by a variable-capacitance element, the frequency response of the filter to restore the frequency response to a predetermined value.

12. The method according to claim 9, wherein the impedance matching network comprises an adjustable capacitor digitally controlled by said at least one digital control signal.

13. The method according to claim 11, wherein the variable-capacitance element is a varactor diode.

14. The method according to claim 9, wherein the measuring comprises:
generating, by a radio frequency signal generator, a plurality of radio frequency signals of different frequencies inside a predetermined frequency band;
receiving, by a resonator, the radio frequency signals generated by the radio frequency signal generator and delivering, for each of these signals of different frequencies, an output signal;
measuring, by a power measuring circuit, the signal power for each of the output signals delivered by said resonator;
determining, by a microcontroller, the resonance frequency of the resonator from the power values measured by the power measuring circuit and generating the control signal for controlling the radio frequency signal generator; and
calculating, by a processor, the relative permittivity of the substrate from said determined resonance frequency.

15. The method according to claim 14, wherein said resonator is a ring resonator.

16. The method according to claim 14, wherein the resonator has a resonance frequency close to the frequency of the radio frequency signals.

17. The method according to claim 14, wherein the device includes at least two channels operating at different operating frequencies, each of the at least two channels:
measuring, by a measuring circuit, a value linked to the permittivity for measuring the relative permittivity of said dielectric substrate, wherein a resonator of the measuring circuit is designed to have a resonance frequency close to the highest operating frequency.

* * * * *